US012610520B2

(12) United States Patent
Chen

(10) Patent No.: US 12,610,520 B2
(45) Date of Patent: Apr. 21, 2026

(54) SEMICONDUCTOR STRUCTURE AND MANUFACTURING METHOD THEREOF

(71) Applicant: CHANGXIN MEMORY TECHNOLOGIES, INC., Hefei City (CN)

(72) Inventor: Tao Chen, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 882 days.

(21) Appl. No.: 17/449,643

(22) Filed: Sep. 30, 2021

(65) Prior Publication Data

US 2022/0102349 A1      Mar. 31, 2022

Related U.S. Application Data

(63) Continuation of application No. PCT/CN2021/103796, filed on Jun. 30, 2021.

(30) Foreign Application Priority Data

Sep. 29, 2020    (CN) .......................... 202011051597.4

(51) Int. Cl.
 *H10B 12/00*      (2023.01)
 *H10W 10/00*      (2026.01)
 *H10W 10/17*      (2026.01)

(52) U.S. Cl.
 CPC ........... *H10B 12/30* (2023.02); *H10B 12/488* (2023.02); *H10W 10/0143* (2026.01); *H10W 10/17* (2026.01)

(58) Field of Classification Search
 CPC ........ H01L 21/76229; H01L 21/76232; H10B 12/09; H10B 12/30; H10B 12/485; H10B 12/488; H10W 10/0143; H10W 10/17
 See application file for complete search history.

(56) References Cited

U.S. PATENT DOCUMENTS

| | | | |
|---|---|---|---|
| 5,929,504 A | 7/1999 | Mogami | |
| 6,197,661 B1 | 3/2001 | Mogami | |
| 2002/0155668 A1* | 10/2002 | Lin ...................... | H01L 21/3221 |
| | | | 438/296 |
| 2009/0108395 A1 | 4/2009 | Choi | |
| 2009/0267125 A1* | 10/2009 | Mikasa .............. | H10D 84/0151 |
| | | | 257/E27.084 |

(Continued)

FOREIGN PATENT DOCUMENTS

| | | |
|---|---|---|
| CN | 1204147 A | 1/1999 |
| CN | 104253079 A | 12/2014 |

(Continued)

*Primary Examiner* — Britt Hanley
*Assistant Examiner* — Kevin Quinto
(74) *Attorney, Agent, or Firm* — Syncoda LLC; Feng Ma

(57) ABSTRACT

A semiconductor structure manufacturing method includes: providing a substrate and etching the substrate to form first trenches; filling each of the first trenches with an oxide layer having a top surface not lower than that of the substrate; etching regions, adjacent to side walls of the first trench, in the oxide layer downwards to form second trenches, wherein a depth of the second trench is less than a depth of the first trench and a width of the second trench is less than half of a width of the first trench; and forming supplementary layers in the second trenches.

15 Claims, 8 Drawing Sheets

(56)                         References Cited

U.S. PATENT DOCUMENTS

| | | | |
|---|---|---|---|
| 2010/0129979 | A1 | 5/2010 | Choi |
| 2016/0172235 | A1 * | 6/2016 | Srinivasan .......... H01L 27/0248 |
| | | | 438/430 |
| 2018/0211866 | A1 * | 7/2018 | Cheng ................... H01L 21/845 |
| 2019/0363093 | A1 * | 11/2019 | Chen ................... H01L 21/0206 |

FOREIGN PATENT DOCUMENTS

| | | | | |
|---|---|---|---|---|
| CN | 104282612 | A | * | 1/2015 |
| CN | 104637860 | A | | 5/2015 |
| CN | 110277312 | A | | 9/2019 |
| CN | 111933689 | A | | 11/2020 |

* cited by examiner

SEMICONDUCTOR STRUCTURE AND MANUFACTURING METHOD THEREOF

CROSS-REFERENCE TO RELATED APPLICATIONS

This is a continuation application of International Patent Application No. PCT/CN2021/103796, filed on Jun. 30, 2021, which claims priority to Chinese Patent Application No. 202011051597.4 filed on Sep. 29, 2020. The disclosures of these applications are hereby incorporated by reference in their entirety.

BACKGROUND

A semiconductor memory chip generally has an array and a periphery. A memory cell array is formed in the array. The periphery includes a periphery device. Currently, a mainstream Shallow Trench Isolation (STI) structure in semiconductor manufacturing generally includes a plurality of trenches which are arranged sequentially and each have a U-shaped cross section, and an active area (AA) defined by the trenches. The cross section of the trench in the STI structure theoretically has the same width from top to bottom, and accordingly the cross section of the corresponding AA theoretically has the same width from top to bottom. A Buried Word Line (BWL) is subsequently etched as needed, and then is connected through a Bit Line Contact (BLC) plug to form a Bit Line (BL). As an integration level of a semiconductor device is increased, the dimensions of the AA and the STI are reduced. The existing STI structure has a leakage problem.

SUMMARY

The present disclosure relates to the technical field of semiconductor structures, and in particular to a semiconductor structure and a manufacturing method thereof.

According to a first aspect of the disclosure, there is provided a manufacturing method of a semiconductor structure, which may include the following operations.

A substrate is provided, and is etched to form first trenches.

Each of the first trenches is filled with an oxide layer having a top surface not lower than a top surface of the substrate.

Regions, adjacent to side walls of the first trench, in the oxide layer are etched downwards, to form second trenches. A depth of the second trench is less than a depth of the first trench and a width of the second trench is less than half of a width of the first trench.

Supplementary layers are formed in the second trenches.

According to a second aspect of the disclosure, there is provided a semiconductor structure. The semiconductor structure may include: a substrate; first trenches located on the substrate; oxide layers located in the first trenches; second trenches located in regions, adjacent to side walls of the first trench, in the oxide layer; and supplementary layers located in the second trenches.

The oxide layer has a top surface not lower than a top surface of the substrate.

A depth of the second trench is less than a depth of the first trench and a width of the second trench is less than half of a width of the first trench.

BRIEF DESCRIPTION OF THE DRAWINGS

Specific features of the disclosed embodiment to which the present disclosure relates are set forth in the appended claims. The features and advantages of the disclosed embodiment to which the present disclosure relates can be better understood with reference to the following detailed description of exemplary implementations and the accompanying drawings. The brief description of the drawings is as follows:

FIG. 5C is a partial diagram of a cross section C-C in FIG. 6.

DETAILED DESCRIPTION

Figures 1A, 1B, 1C:
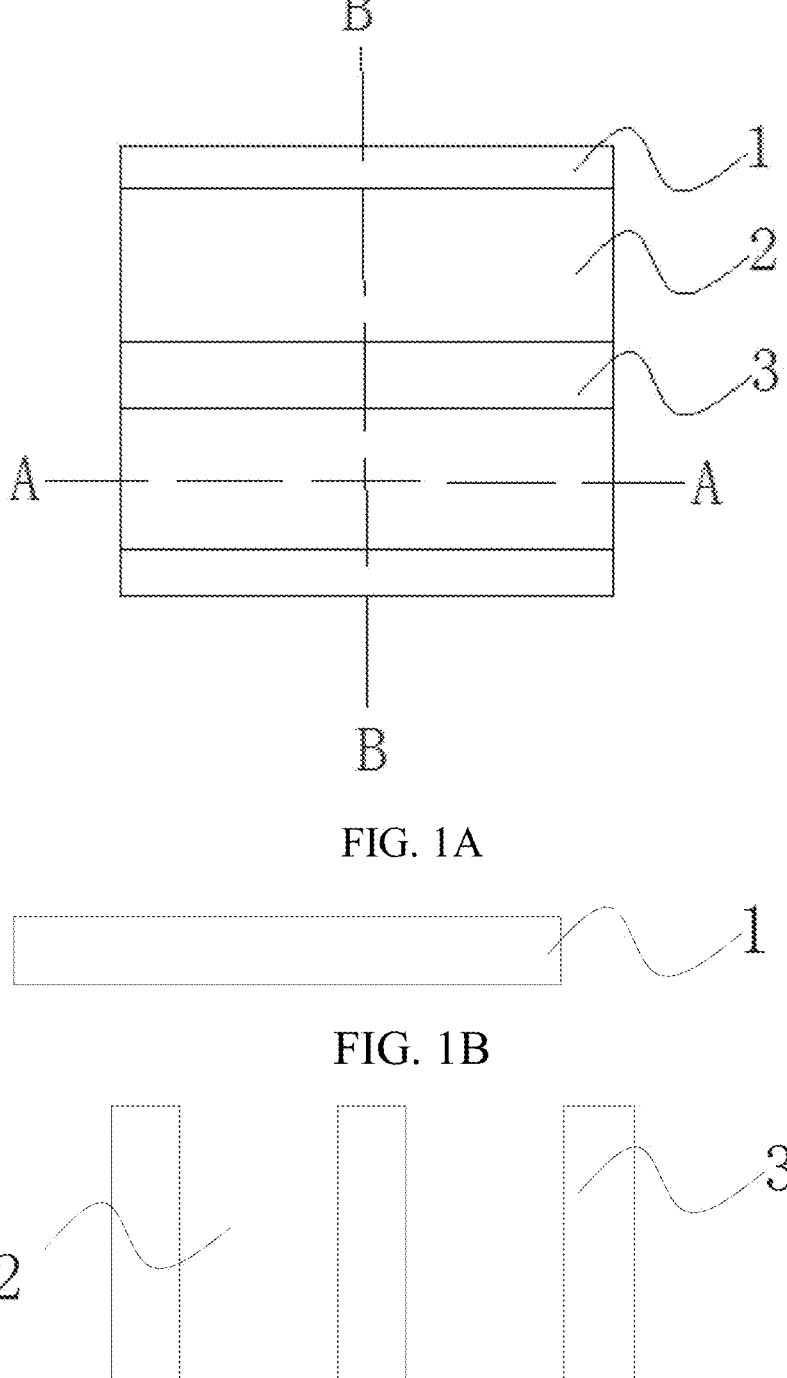
FIG. 1A is an example of forming first trenches in a manufacturing method of a semiconductor structure according to an embodiment of the present disclosure.
FIG. 1B is a diagram of a cross section A-A in FIG. 1A.
FIG. 1C is a diagram of a cross section B-B in FIG. 1A.

Implementations of the present disclosure are described below by particular specific embodiments. Other advantages and efficiencies of the embodiment of the present disclosure will become apparent to those skilled in the art from the disclosure herein.

In order to make the objects, technical features, and beneficial effects of the embodiment of the present disclosure clearer and more understandable, specific implementations of the present disclosure are described in further detail below with reference to the accompanying drawings. The described embodiment is only a portion, but not all, of the implementations of the present disclosure, and should not be construed as being limited to the implementations set forth herein. Rather, these implementations are provided so that the present disclosure will be thorough and complete, and the concepts of the example implementations are fully communicated to those skilled in the art. When describing the embodiment of the present disclosure in detail, the schematic diagrams are merely exemplary and are not intended to limit the scope of the embodiment of the present disclosure herein, for purposes of explanation. Three-dimensional space dimensions of length, width, and depth should be included in actual manufacturing. The same reference numerals in the figures indicate the same or similar structures, and thus the detailed descriptions thereof are omitted.

The terms "one", "a/an", "this", and "the" are used to indicate the presence of one or more elements/components/etc. The terms "including" and "having" are used in an open-type inclusive sense and mean that there may be additional elements/components/etc. in addition to the listed elements/components/etc. The terms "first" and "second" are used merely as markers and are not intended to limit the number of objects.

As an integration level of a semiconductor device is increased, the dimensions of the AA and the STI are reduced, and an STI structure can have a leakage problem.

A STI area structure may cause a small area of an AA and a small area of an AA landing area, which would not conducive to subsequent landing of an SNC or of an electrical contact of another device. For example, a semiconductor structure generally includes an STI area consisting of a plurality of trenches which are arranged sequentially and each have a U-shaped cross section, and an AA defined by the STI area. The cross section of each of the trenches in the STI structure theoretically has the same width from top to bottom, and accordingly the cross section of the corresponding AA theoretically has the same width from top to bottom. As an integration level of a semiconductor device is increasing, the existing semiconductor structure has a leakage problem. Moreover, the small area of the AA and the small area of AA landing area are not conductive to the subsequent landing of an SNC or of an electrical contact of another device.

A manufacturing method of a semiconductor structure usually has a small application range. For example, according to different manufacturing precisions, the manufacturing method of the semiconductor structure can only be applied to a technology such as Extreme Ultra-Violet (EUV) or Pitch Doubling (PD), and corresponding devices need to be equipped according to different manufacturing precisions. As such, the enterprise cost is increased, and the industrial production is greatly limited. It will be beneficial in application effects to develop a manufacturing method of a semiconductor structure having a wide application range.

An embodiment of the present disclosure discloses a manufacturing method of a semiconductor structure. By improving the existing manufacturing method, the insulating property of an STI is significantly improved, and the leakage problem is better solved. A supplementary layer of an AA is formed, so that the area of the AA is increased, the resistance value is reduced, and an AA landing area is increased, to facilitate subsequent landing of an SNC or of an electrical contact of another device.

Referring to FIGS. 1A, 1B and 1C, an example of forming first trenches 2 in a manufacturing method of a semiconductor structure according to an embodiment of the present disclosure is shown. As shown in FIGS. 1A, 1B and 1C, the method includes the following operation.

A substrate 1 is provided, and the substrate 1 is etched to form first trenches 2.

The substrate 1 adopts a conventional substrate 1 in the art, such as a silicon substrate or a silicon germanium substrate.

The first trenches 2 may be formed by etching. In one embodiment, an etching region may be defined by exposure and development (PHOTO), and an oxide layer is then etched to a desired depth by etching (ETCH).

Figure 2A:
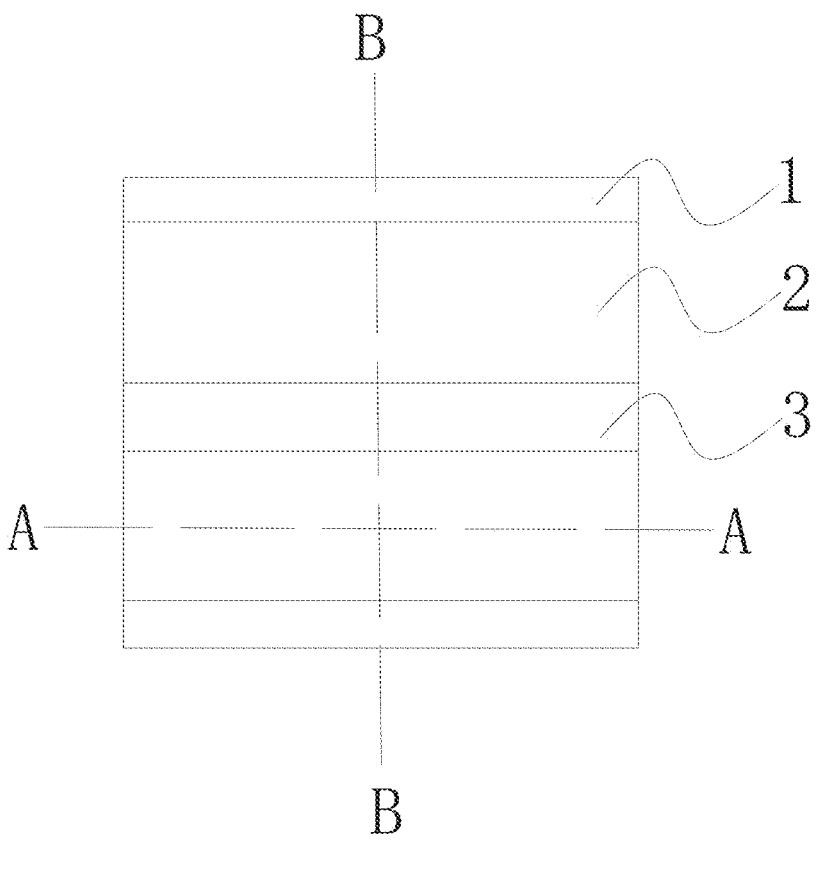
FIG. 2A is an example of forming oxide layers in a manufacturing method of a semiconductor structure according to an embodiment of the present disclosure.
Figure 2B:
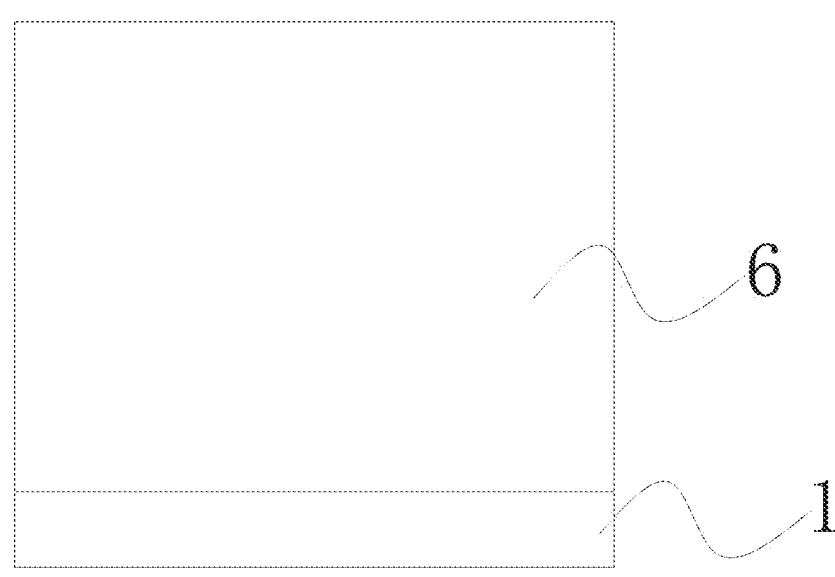
FIG. 2B is a diagram of a cross section A-A in FIG. 2A.
Figure 2C:
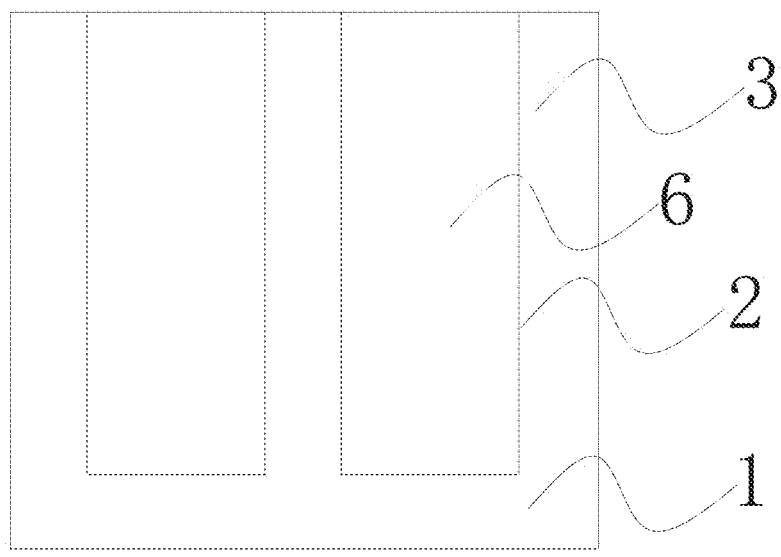
FIG. 2C is a diagram of a cross section B-B in FIG. 2A.

Referring to FIGS. 2A, 2B and 2C, an example of forming oxide layers 6 in a manufacturing method of a semiconductor structure according to an embodiment of the present disclosure is shown. As shown in FIGS. 2A, 2B and 2C, the method includes the following operation.

Each of the first trenches 2 is filled up with an oxide layer 6, and the oxide layer is polished to adjust its surface flatness so that a top surface of the oxide layer 6 is not lower than a top surface of the substrate 1.

The oxide layer 6 may be specifically selected from oxides commonly used in the art, such as silicon dioxide.

Figure 3A:
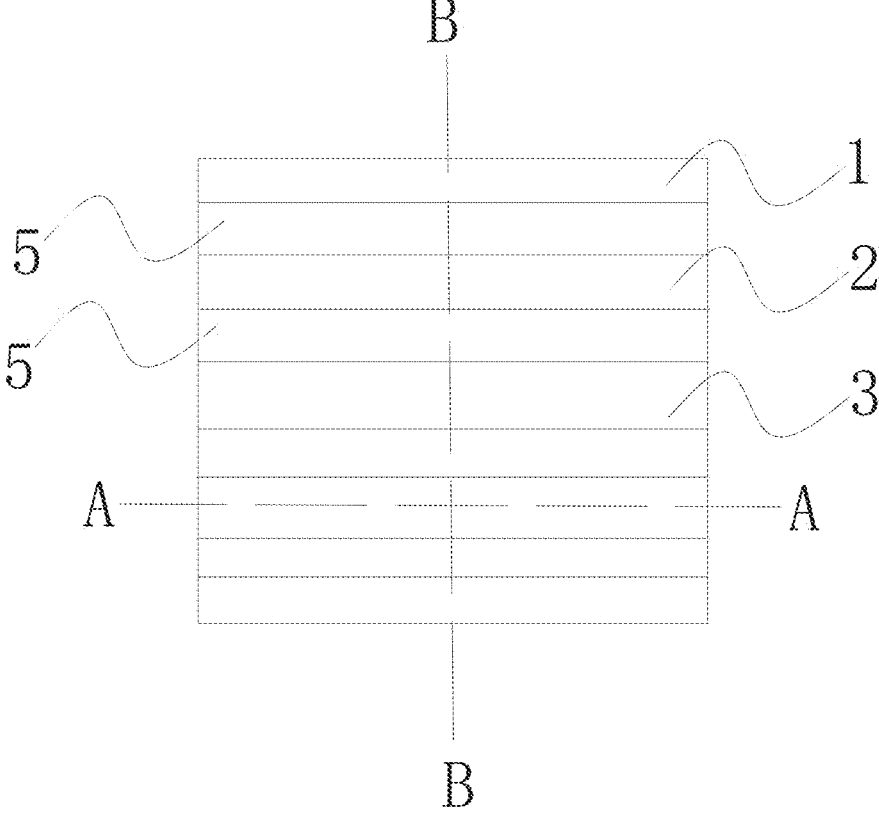
FIG. 3A is an example of forming second trenches in a manufacturing method of a semiconductor structure according to an embodiment of the present disclosure.
Figure 3B:
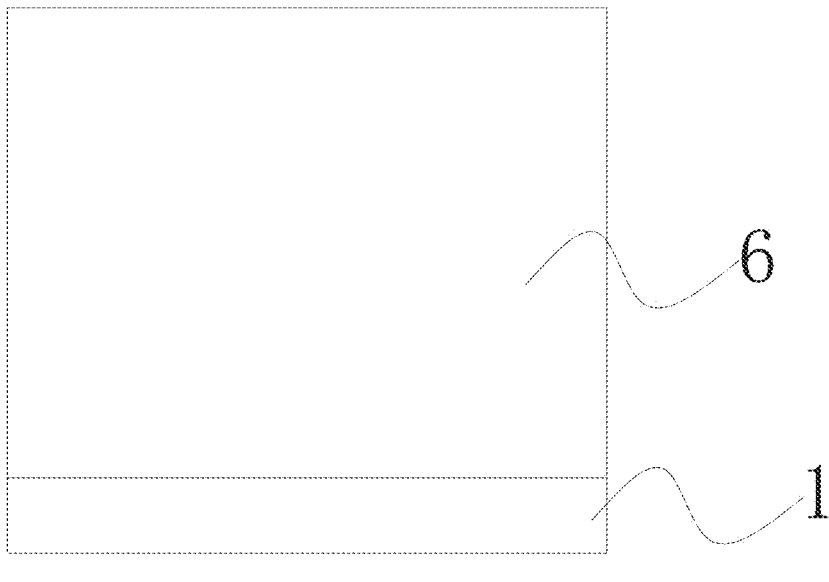
FIG. 3B is a diagram of a cross section A-A in FIG. 4A.
Figure 3C:
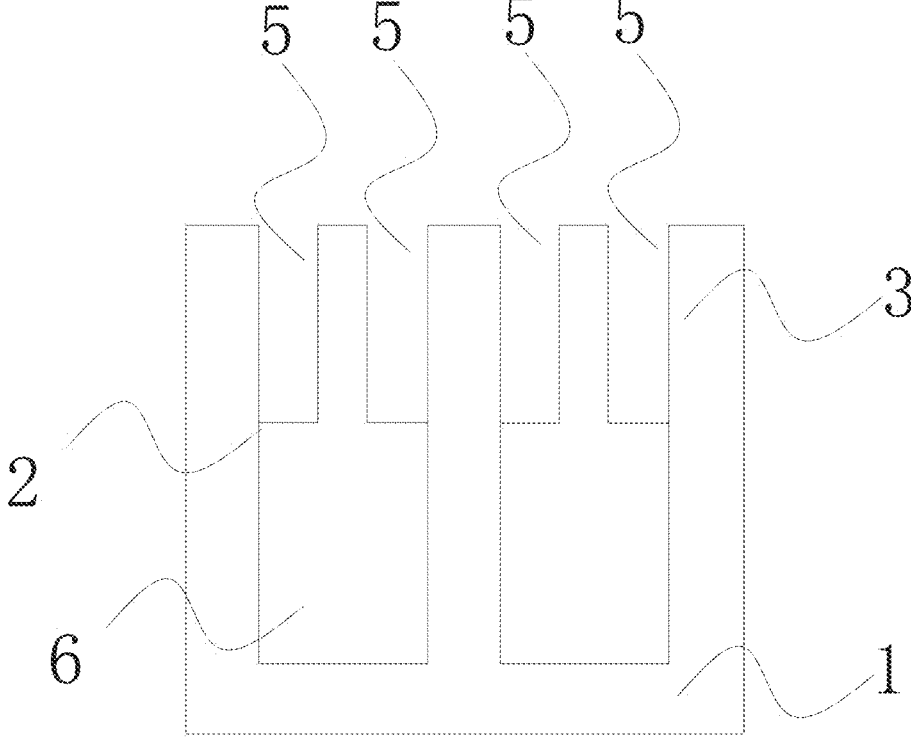
FIG. 3C is a diagram of a cross section B-B in FIG. 4A.

Referring to FIGS. 3A, 3B and 3C, an example of forming second trenches 5 in a manufacturing method of a semiconductor structure according to an embodiment of the present disclosure is shown. As shown in FIGS. 3A, 3B and 3C, the method includes the following operation.

Regions, adjacent to side walls of the first trench 2, in the oxide layer 6 are etched downwards to form second trenches 5. A depth of the second trench 5 is less than a depth of the first trench 2, and a width of the second trench 5 is less than half of a width of the first trench 2.

The depth of the first trench 2 is 300-400 nm and the depth of the second trench 5 is 150-200 nm.

The substrate 1 includes an array and a periphery. The array includes an active area 3 and a shallow trench isolation area.

When the first trench 2 is formed in the array, the width of the first trench 2 is 20-40 nm, and the width of the second trench 5 is 5-15 nm.

When the first trench 2 is formed in the periphery, the width of the first trench 2 is 70-110 nm, and the width of the second trench 5 is 30-50 nm.

The second trench 5 may be formed by etching. In one embodiment, the etching region may be defined by photolithography, and the oxide layer is then etched to a desired depth by ETCH.

The etching of the second trench 5 may be defined according to a depth of a word line (WL) structure in a subsequent specific application, and a Critical Dimension (CD) (usually referred to as a stripe width) is etched secondarily.

Figure 4A:
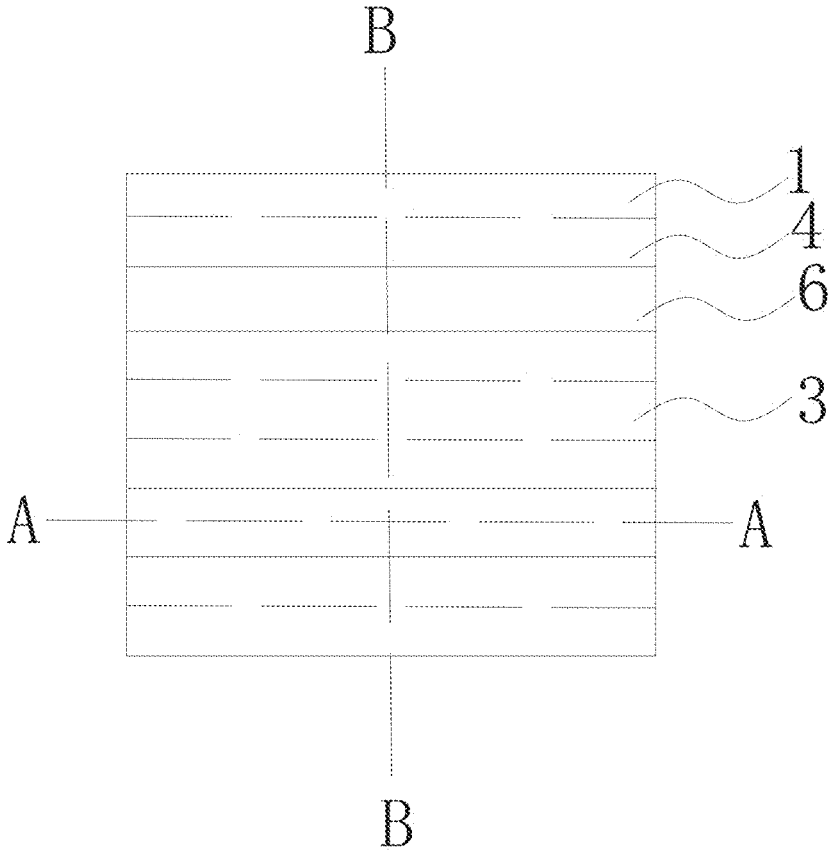
FIG. 4A is an example of forming supplementary layers in a manufacturing method of a semiconductor structure according to an embodiment of the present disclosure.
Figure 4B:
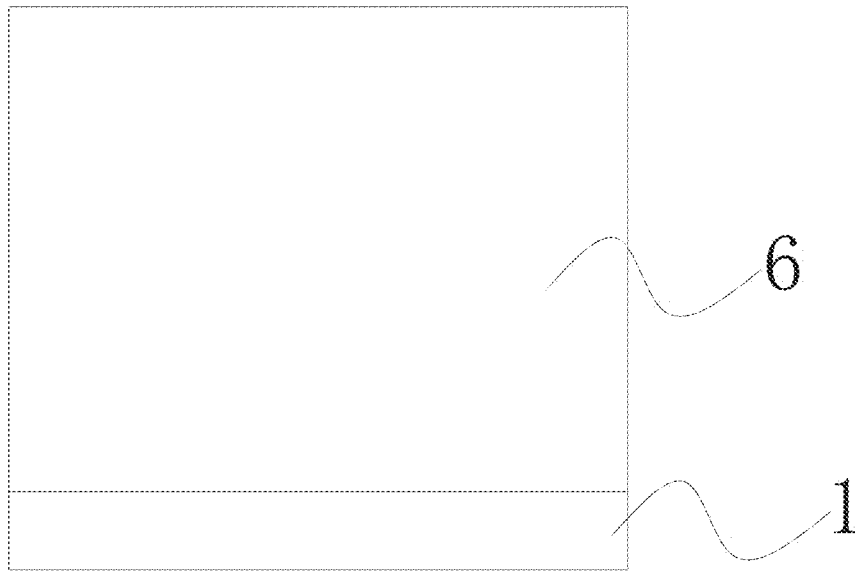
FIG. 4B is a diagram of a cross section A-A in FIG. 4A.
Figure 4C:
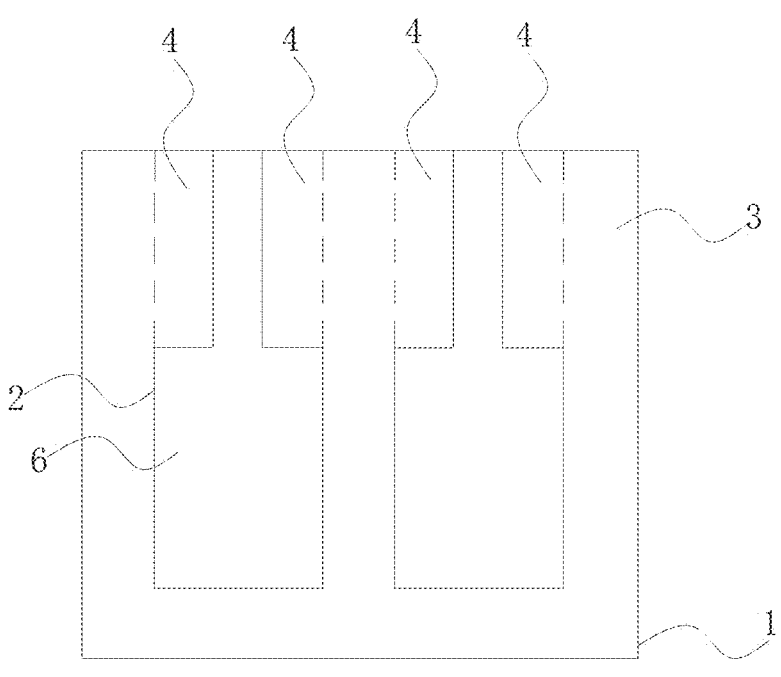
FIG. 4C is a diagram of a cross section B-B in FIG. 4A.

Referring to FIGS. 4A, 4B and 4C, an example of forming supplementary layers 4 in a manufacturing method of a semiconductor structure according to an embodiment of the present disclosure is shown. As shown in FIGS. 4A, 4B and 4C, the method includes the following operation.

Supplementary layers 4 are formed in the second trenches 5.

The supplementary layer 4 includes monocrystalline silicon grown directly epitaxially from the substrate or deposited doped polycrystalline silicon.

The manufacturing method of the semiconductor structure further includes the following operation. A protective layer is formed on the substrate 1 before the first trenches 2 are formed by etching.

In one implementation, the protective layer and the substrate 1 are etched when the first trenches 2 are formed by etching so that the first trenches 2 penetrate through the protective layer. The protective layer can not only protect the top surface of the substrate 1, but also promote the supplementary layer 4 to grow only on a side wall of the second trench 5 instead of the top surface of the substrate 1 when the supplementary layer 4 is epitaxially grown.

In one implementation, the manufacturing method of the semiconductor structure further includes the following operation. A first ion implantation is performed on the substrate 1, after forming the oxide layers 6 and before forming the second trenches 5.

In one implementation, the manufacturing method of the semiconductor structure further includes the following operation. A second ion implantation, which has an opposite ion doping type to the first ion implantation, is performed on the substrate 1 after forming the supplementary layers 4.

In one implementation, the supplementary layer 4 is formed by epitaxial growth of a side wall of the second trench 5 close to the substrate. When the second ion implantation is performed on the substrate 1, the second ion implantation is also performed on the supplementary layer 4.

The supplementary layer 4 is a deposited doped polycrystalline silicon layer having a doping type same as the ion doping type of the second ion implantation.

The ion type of the ion implantation is selected from ion types commonly used in the art, such as an ion of group III (N-type) element or an ion of group V (P-type) element. The ion of group III (N-type) element and the ion of group V (P-type) element are ions of opposite conduction types. The second ion implantation and the first ion implantation have opposite ion doping types, and the ions can be selected as ions of opposite types as needed.

In one implementation, an opposite type (opposite to the ion implantation type of the AA 3) ion implantation is performed around the STI, which can increase the isolation effect of the STI and better prevent leakage. In a further implementation, an opposite type doping ion implantation is performed around a wider lower portion of the STI, which can better prevent leakage between AAs through the lower portion of the STI. If the type of the doped ion in the AA is N-type, then the type of the doped ion around the STI is P-type. As such, the ion implantation can further increase the isolation effect of the STI to prevent leakage.

Figure 5A:
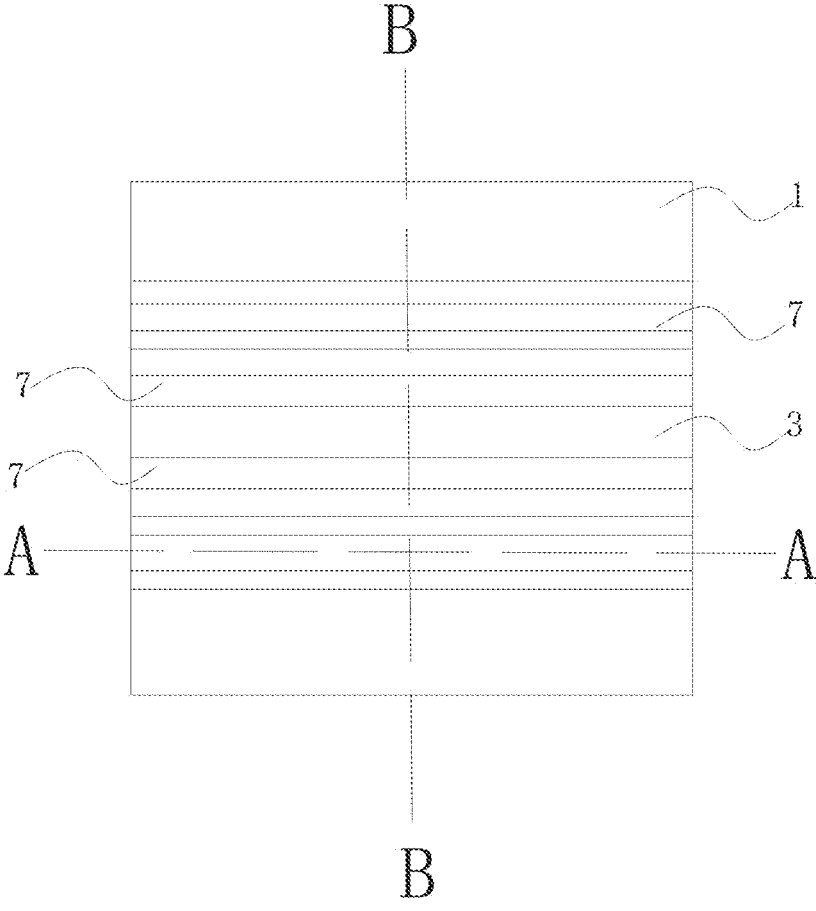
FIG. 5A is an example of forming third trenches and word line structures in a manufacturing method of a semiconductor structure according to an embodiment of the present disclosure.
Figure 5B:
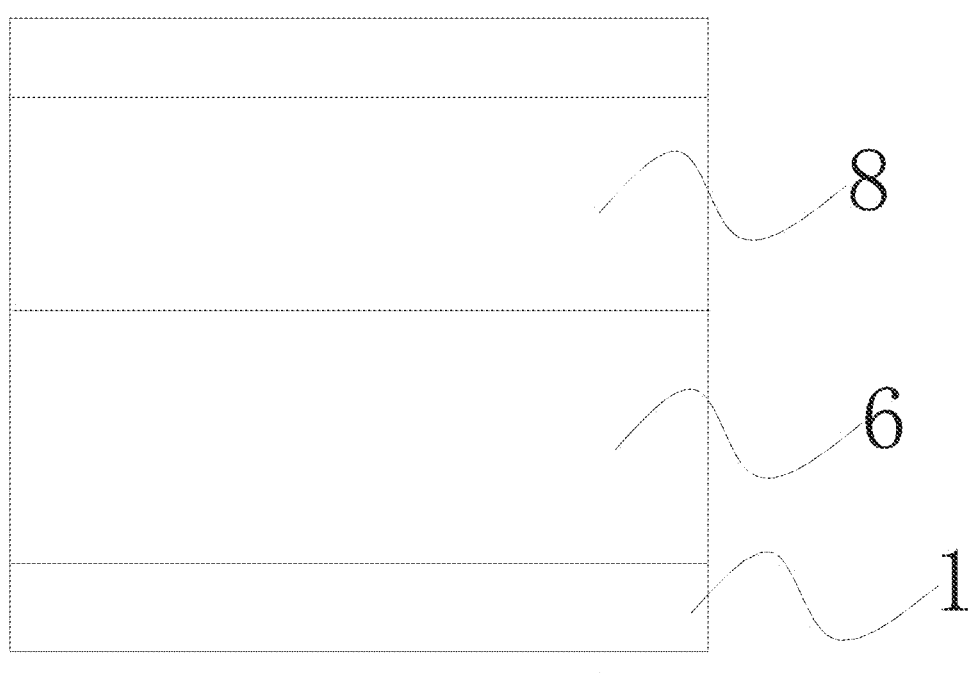
FIG. 5B is a diagram of a cross section A-A in FIG. 5A.
Figure 5C:
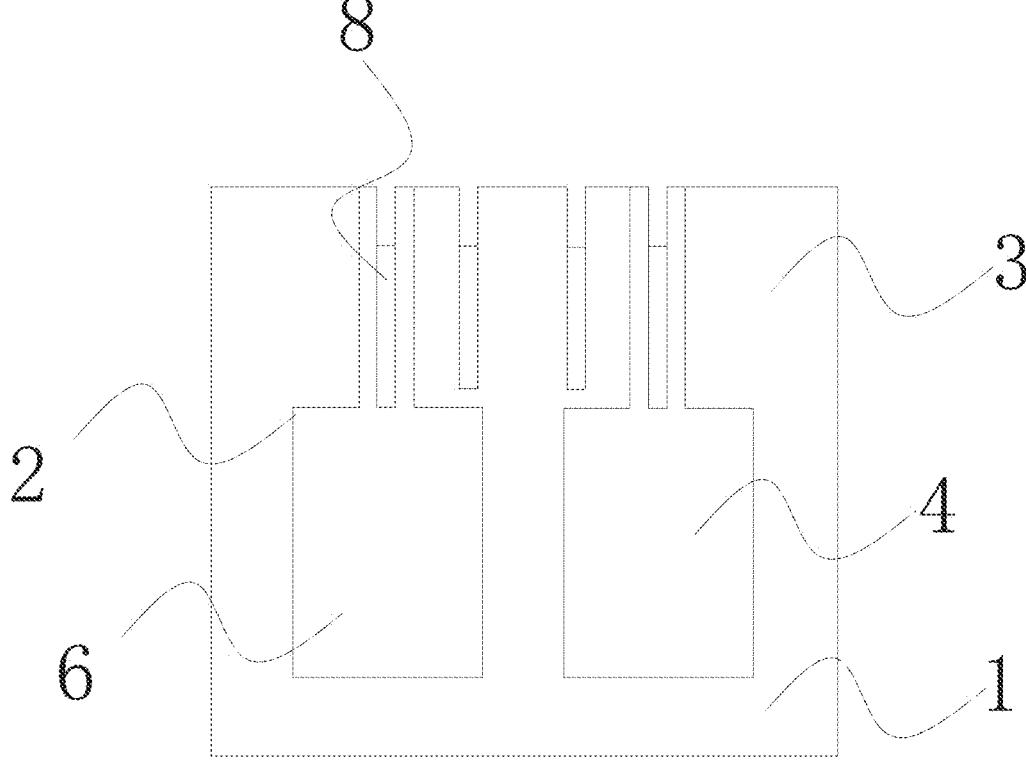
FIG. 5C is a diagram of a cross section B-B in FIG. 5A.

Referring to FIGS. 5A, 5B and 5C, an example of forming third trenches 7 and word line structures 8 in a manufacturing method of a semiconductor structure according to an embodiment of the present disclosure is shown. As shown in FIGS. 5A, 5B and 5C, the method includes the following operations.

Third trenches 7 are formed in the array after forming the supplementary layers 4.

A depth of the third trench 7 is less than or equal to the depth of the second trench 5.

Word line structures 8 are formed in the third trenches 7.

The forming of the word line structures 8 includes: sequentially forming a gate dielectric layer, a metal electrode layer, a metal barrier layer, and an insulating cover layer. The insulating cover layer covers the metal electrode layer and the metal barrier layer, and a top of the insulating cover layer is flush with an upper surface of the substrate.

Etching, filling, polishing, and growing in the manufacturing method of the embodiment of the present disclosure preferably adopt conventional technologies in the art, and are suitable for industrial production. For example, an etching region may be defined by photo in the etching, and then etched to a desired depth by an etching technology, or one of existing technologies such as PD or EUV. The filling may adopt Chemical Vapor Deposition (CVD) and thermal oxide growth or in-situ vapor growth oxide layer technologies, or other common film deposition technologies. The polishing may adopt Chemical Mechanical Polishing (CMP). A crystal may be grown by using a silicon epitaxial growth technology or a polycrystalline silicon deposition technology.

Figure 6:
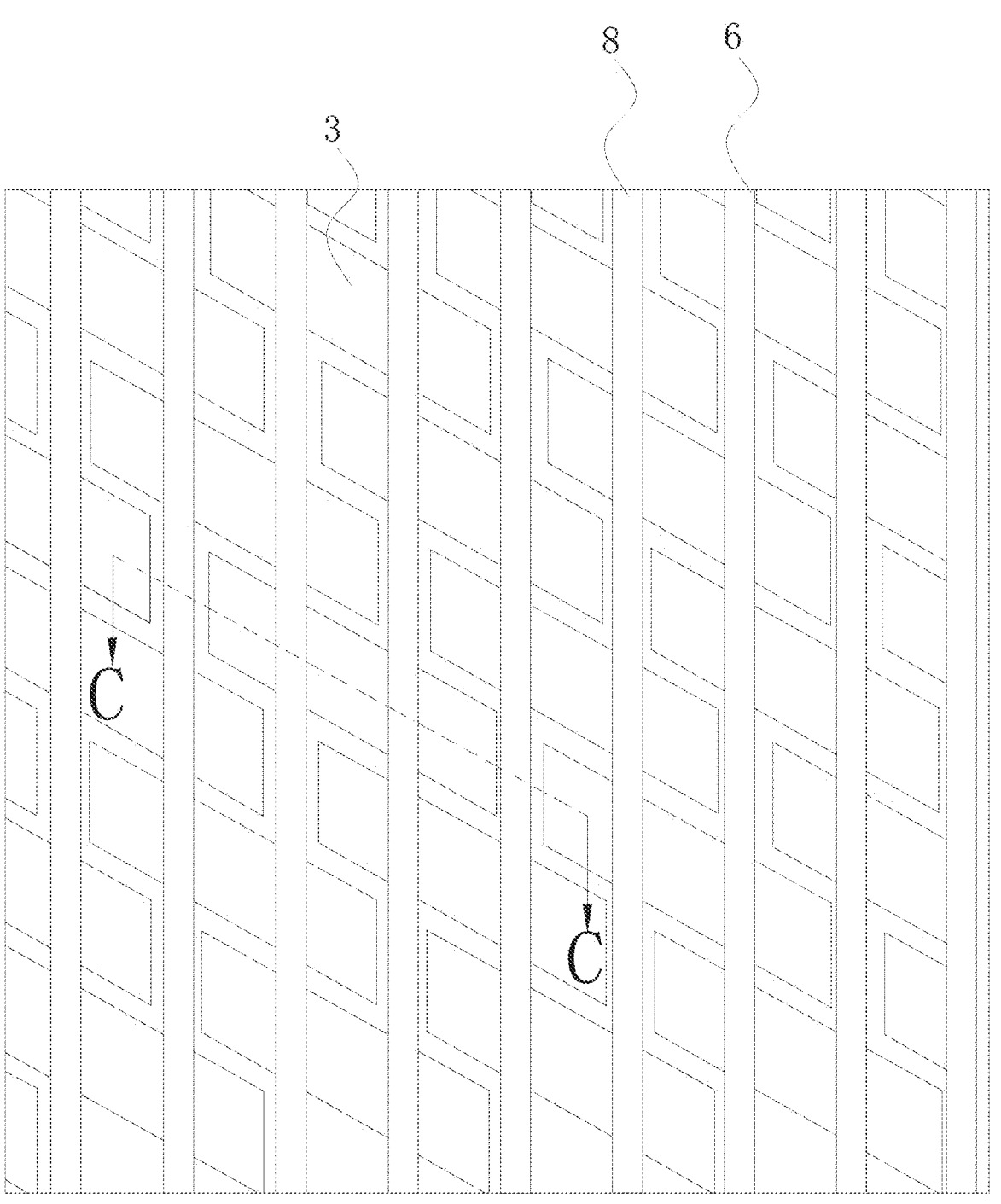
FIG. 6 is an example of a semiconductor structure according to an embodiment of the present disclosure.

Referring to FIG. 6, an example of an array of a semiconductor structure according to an embodiment of the present disclosure is shown. FIG. 5C is a partial diagram of a cross section C-C in FIG. 6.

According to the manufacturing method of the semiconductor structure in the embodiment of the present disclosure, an insulating channel having a cross section with a narrow upper portion and a wide lower portion is formed. By a deep and wide bottom of a STI, the insulating property of the STI can be significantly improved, and a leakage problem can be better solved. A supplementary layer of an AA is formed, so that the area of the AA is increased, the resistance value is reduced, and an AA landing area is increased, to facilitate subsequent landing of an SNC or of an electrical contact of other device.

The manufacturing method of the semiconductor structure in the embodiment of the present disclosure has the advantages of being simple to operate and easy for industrial mass production.

The semiconductor structure in the embodiment of the present disclosure is applicable not only to an array of a Dynamic Random-Access Memory (DRAM), but also to a periphery of the DRAM.

The manufacturing method of the semiconductor structure in the embodiment of the present disclosure is applicable to EUV or PD technologies, etc., and has a wide application range.

What is claimed is:

1. A manufacturing method of a semiconductor structure, comprising:

providing a substrate, and etching the substrate to form first trenches;

filling each of the first trenches with an oxide layer having a top surface not lower than a top surface of the substrate;

etching regions, adjacent to side walls of the first trench, in the oxide layer downwards to form second trenches, wherein a depth of the second trench is less than a depth of the first trench and a width of the second trench is less than half of a width of the first trench;

forming supplementary layers in the second trenches;

performing a first ion implantation on the substrate after forming the oxide layers and before forming the second trenches; and performing a second ion implantation, which has an opposite ion doping type to the first ion implantation, on the substrate after forming the supplementary layers.

2. The manufacturing method of claim 1, wherein the depth of the first trench is 300-400 nm and the depth of the second trench is 150-200 nm.

3. The manufacturing method of claim 1, further comprising: forming a protective layer on the substrate before the first trenches are formed by etching; and etching the protective layer and the substrate when the first trenches are formed by etching, so that the first trenches penetrate through the protective layer.

4. The manufacturing method of claim 1, wherein the supplementary layer is formed by epitaxial growth of a side wall of the second trench close to the substrate; and when the second ion implantation is performed on the substrate, the second ion implantation is also performed on the supplementary layer.

5. The manufacturing method of claim 1, wherein the supplementary layer is a deposited doped polycrystalline silicon layer having a doping type same as the ion doping type of the second ion implantation.

6. The manufacturing method of claim 1, wherein the substrate comprises an array and a periphery.

7. The manufacturing method of claim 6, wherein the first trench is formed in the periphery, the width of the first trench is 70-110 nm, and the width of the second trench is 30-50 nm.

8. The manufacturing method of claim 6, wherein the first trench is formed in the array, the width of the first trench is 20-40 nm, and the width of the second trench is 5-15 nm.

9. The manufacturing method of claim 8, further comprising:

forming third trenches in the array after forming the supplementary layers; and forming word line structures in the third trenches,
  wherein a depth of the third trench is less than or equal
    to the depth of the second trench.

10. A semiconductor structure, comprising:
a substrate comprising an array and a periphery;
first trenches located on the substrate;
oxide layers located in the first trenches, the oxide layer
  having a top surface not lower than a top surface of the
  substrate;
second trenches located in regions, adjacent to side walls
  of the first trench, in the oxide layer, wherein a depth of
  the second trench is less than a depth of the first trench
  and a width of the second trench is less than half of a
  width of the first trench;
supplementary layers located in the second trenches; and
third trenches located in the array; and word line struc-
  tures located in the third trenches, wherein a depth of
  the third trench is less than or equal to the depth of the
  second trench.

11. The semiconductor structure of claim 10, wherein the
depth of the first trench is 300-400 nm and the depth of the
second trench is 150-200 nm.

12. The semiconductor structure of claim 10, wherein the
first trench is located in the array, the width of the first trench
is 20-40 nm, and the width of the second trench is 5-15 nm.

13. The semiconductor structure of claim 10, wherein the
first trench is located in the periphery, the width of the first
trench is 70-110 nm, and the width of the second trench is
30-50 nm.

14. The semiconductor structure of claim 10, wherein the
supplementary layer is a deposited doped polycrystalline
silicon layer.

15. The semiconductor structure of claim 14, wherein the
doped polycrystalline silicon layer has an ion doping type
same as an ion doping type of the substrate.

\* \* \* \* \*